(12) United States Patent
Maassen et al.

(10) Patent No.: US 11,798,777 B2
(45) Date of Patent: Oct. 24, 2023

(54) CHARGED PARTICLE BEAM APPARATUS, AND SYSTEMS AND METHODS FOR OPERATING THE APPARATUS

(71) Applicant: ASML Netherlands B.V., Veldhoven (NL)

(72) Inventors: Martinus Gerardus Maria Johannes Maassen, San Francisco, CA (US); Peter Paul Hempenius, Nuenen (NL); Weiming Ren, San Jose, CA (US); Zhongwei Chen, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 0 days.

(21) Appl. No.: 16/824,499

(22) Filed: Mar. 19, 2020

(65) Prior Publication Data
US 2020/0286707 A1   Sep. 10, 2020

Related U.S. Application Data

(63) Continuation of application No. PCT/EP2018/074985, filed on Sep. 14, 2018.
(Continued)

(51) Int. Cl.
*H01J 37/21* (2006.01)
*H01J 37/244* (2006.01)
*H01J 37/28* (2006.01)

(52) U.S. Cl.
CPC ............ *H01J 37/21* (2013.01); *H01J 37/244* (2013.01); *H01J 37/28* (2013.01); *H01J 2237/0453* (2013.01); *H01J 2237/2817* (2013.01)

(58) Field of Classification Search
None
See application file for complete search history.

(56) References Cited

U.S. PATENT DOCUMENTS 9,099,282 B2 * 8/2015 Rogers ............... H01J 37/153
10,325,753 B2 * 6/2019 Masnaghetti ........... H01J 37/21
(Continued)

FOREIGN PATENT DOCUMENTS

| CN | 103688333 A | 3/2014 |
|---|---|---|
| JP | 2001118537 A | 4/2001 |

(Continued)

OTHER PUBLICATIONS

PCT Notification of Transmittal of the International Search Report of the International Searching Authority dated Nov. 30, 2018, in the corresponding PCT International Application No. PCT/EP2018/074985 (2 pgs.).
(Continued)

*Primary Examiner* — Andrew Smyth
(74) *Attorney, Agent, or Firm* — Finnegan, Henderson, Farabow, Garrett & Dunner, LLP

(57) ABSTRACT

A charged particle beam apparatus includes a beamlet forming unit configured to form and scan an array of beamlets on a sample. A first portion of the array of beamlets is focused onto a focus plane, and a second portion of the array of beamlets has at least one beamlet with a defocusing level with respect to the focus plane. The charged particle beam apparatus also includes a detector configured to detect an image of the sample formed by the array of beamlets, and a processor configured to estimate a level of separation between the focus plane and the sample based on the detected image and then reduce the level of separation based on the estimated level.

20 Claims, 7 Drawing Sheets

Related U.S. Application Data

(60) Provisional application No. 62/560,622, filed on Sep. 19, 2017.

(56) References Cited

U.S. PATENT DOCUMENTS

| | | | |
|---|---|---|---|
| 2003/0006371 A1 | 1/2003 | Watanabe et al. | |
| 2011/0210248 A1 | 9/2011 | Hirose et al. | |
| 2014/0224985 A1* | 8/2014 | Rodgers | H01J 37/29 250/307 |
| 2017/0084424 A1* | 3/2017 | Masnaghetti | H01J 37/28 |
| 2017/0117114 A1* | 4/2017 | Zeidler | H01J 37/28 |
| 2017/0229279 A1* | 8/2017 | Brodie | H01J 37/153 |
| 2017/0248842 A1* | 8/2017 | Oster | C23C 14/28 |
| 2019/0172675 A1* | 6/2019 | Masnaghetti | H01J 37/153 |

FOREIGN PATENT DOCUMENTS

| | | |
|---|---|---|
| JP | 2003-016983 A | 1/2003 |
| JP | 2007-087639 A | 4/2007 |
| JP | 2008-117643 A | 5/2008 |
| JP | 2008159286 A | 7/2008 |
| JP | 2010-244740 A | 10/2010 |
| JP | 2013097869 A | 5/2013 |
| TW | 200737268 A | 10/2007 |
| TW | 201503204 A | 1/2015 |
| WO | WO 2017/053812 A1 | 3/2017 |
| WO | WO-2017053812 A1 * | 3/2017 ............. H01J 37/21 |

OTHER PUBLICATIONS

Notice of Reasons for Rejection issued in related Japanese Patent Application No. 2020-512575; dated Apr. 1, 2021 (9 pgs.).
Office Action of the Intellectual Property Office of Taiwan issued in related Taiwanese Patent Application No. 109109852; dated Apr. 15, 2021 (11 pgs.).
Notification of Reason(s) for Refusal issued in related Korean Patent Application No. 10-2020-7007935; dated Oct. 19, 2021 (10 pgs.).
First Office Action issued in related Chinese Patent Application No. 201880060710.X; dated May 23, 2022 (5 pgs.).
Office Action of the Intellectual Property issued in related Taiwanese Patent Application No. 110139089; dated Jul. 11, 2022 (12 pgs.).
Notice of Reasons for Rejection issued by the Japan Patent Office in related Japanese Patent Application No. 2021-179113; dated Nov. 11, 2022 (6 pgs.).

* cited by examiner

CHARGED PARTICLE BEAM APPARATUS, AND SYSTEMS AND METHODS FOR OPERATING THE APPARATUS

CROSS-REFERENCE TO RELATED APPLICATIONS

This application claims priority to International Application No. PCT/EP2018/074985, filed Sep. 14, 2018, and published as WO 2019/057644 A1, which claims priority of U.S. Provisional Application 62/560,622 which was filed on Sep. 19, 2017. The contents of these applications are incorporated herein in their entireties by reference.

TECHNOLOGY FIELD

The present disclosure generally relates to charged particle beam apparatus, systems, and methods for operating the apparatus.

BACKGROUND

In manufacturing processes of integrated circuits (ICs), unfinished or finished circuit components are inspected to ensure that they are manufactured according to design and are free of defects. An inspection system utilizing an optical microscope typically has image resolution down to a few hundred nanometers; and the image resolution is limited by the wavelength of light. As the physical sizes of IC components continue to reduce down to a sub-100 or even sub-10 nanometers, inspection systems capable of higher image resolution than those utilizing optical microscopes are needed.

An electron beam based microscope, such as a scanning electron microscope (SEM) or a transmission electron microscope (TEM), capable of image resolution down to less than a nanometer, serves as a practicable tool for inspecting IC components having a feature size that is sub-100 nanometers.

To improve the throughput of the electron beam based microscope, a plurality of electron beams each with a relatively small current is employed. The plurality of electron beams can respectively and simultaneously scan a plurality of scanning areas on a surface of a sample. To ensure the plurality of electron beams provide high image resolutions during inspection, it is desirable to keep the plurality of electron beams focused on the sample surface.

SUMMARY

According to some embodiments of the disclosure, a charged particle beam apparatus is provided. The charged particle beam apparatus includes a beamlet forming unit configured to form and scan an array of beamlets on a sample. A first portion of the array of beamlets is focused onto a focus plane, and a second portion of the array of beamlets has at least one beamlet with a defocusing level with respect to the focus plane. The charged particle beam apparatus also includes a detector configured to detect an image of the sample formed by the array of beamlets, and a processor configured to estimate a level of separation between the focus plane and the sample based on the detected image and then reduce the level of separation based on the estimated level.

According to some embodiments of the disclosure, a method of controlling a charged particle beam apparatus is provided. The method includes forming an array of beamlets on a sample. A first portion of the array of beamlets is focused onto a focus plane, and a second portion of the array of beamlets has at least one beamlet with a defocusing level with respect to the focus plane. The method also includes detecting an image of the sample formed by the array of beamlets, estimate a level of separation between the focus plane and the sample based on the detected image, and reducing the level of separation based on the estimated level.

According to some embodiments of the disclosure, a method performed by a controller for controlling a charged particle beam system is provided. The method includes estimating a level of separation between a focus plane and a sample based on an image of the sample formed by an array of beamlets. A first portion of the array of beamlets is focused onto the focus plane, and a second portion of the array of beamlets has at least one beamlet with a defocusing level with respect to the focus plane. The method also includes adjusting the level of separation based on the estimated separation level.

According to some embodiments of the disclosure, a non-transitory computer-readable medium is provided. The non-transitory computer-readable medium stores a set of instructions that is executable by at least one processor of a controller to cause the controller to perform a method for controlling a charged particle beam system. The method includes estimating a level of separation between a focus plane and a sample based on an image of the sample formed by an array of beamlets. A first portion of the array of beamlets is focused onto the focus plane, and a second portion of the array of beamlets has at least one beamlet with a defocusing level with respect to the focus plane. The method also includes adjusting the level of separation based on the estimated separation level.

BRIEF DESCRIPTION OF THE DRAWINGS

The accompanying drawings, which are incorporated in and constitute a part of this specification, illustrate several embodiments.

DESCRIPTION

Reference will now be made in detail to the example embodiments, which are illustrated in the accompanying drawings. Although the following embodiments are described in the context of utilizing electron beams, the disclosure is not so limited. Other types of charged particle beams can be similarly applied.

Some disclosed embodiments provide a charged particle beam (e.g., electron beam) apparatus. The charged particle beam apparatus includes a beamlet forming unit configured to form and scan an array of beamlets on a sample. A first portion of the array of beamlets (hereinafter referred to as "inspection beamlets") is configured to be focused onto a focus plane. A second portion of the array of beamlets (hereinafter referred to as "focus-sensing beamlets") has at least one beamlet with a defocusing level with respect to the focus plane. A level of separation between the focus plane and the sample can be detected based on an image of the sample formed by the array of beamlets. The level of separation can be reduced to ensure that the first portion of the array of beamlets is focused on the sample.

As used herein, unless specifically stated otherwise, the term "or" encompasses all possible combinations, except where infeasible. For example, if it is stated that a database can include A or B, then, unless specifically stated otherwise or infeasible, the database can include A, or B, or A and B. As a second example, if it is stated that a database can include A, B, or C, then, unless specifically stated otherwise or infeasible, the database can include A, or B, or C, or A and B, or A and C, or B and C, or A and B and C.

Figure 1:
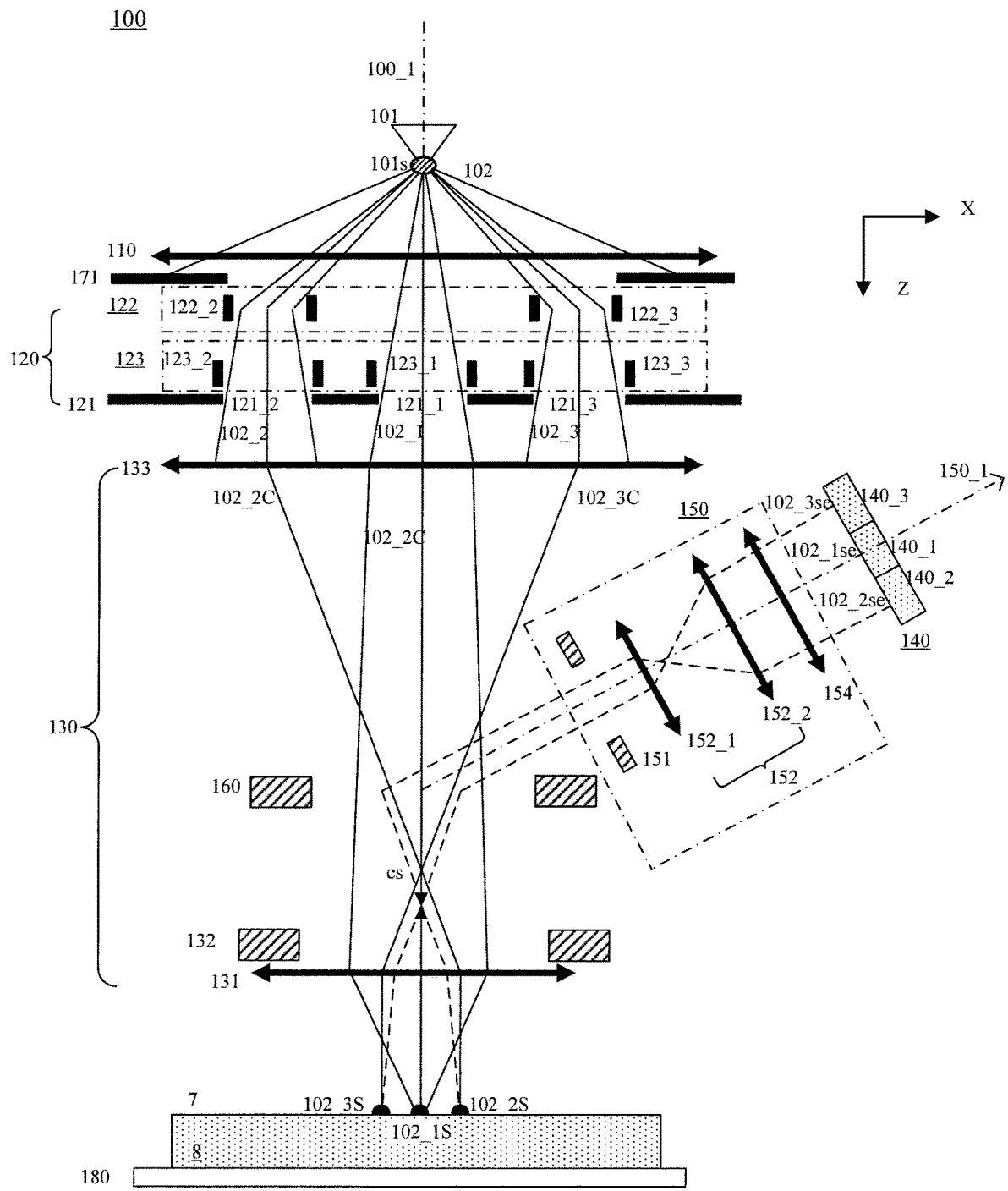
FIG. 1 is a diagram illustrating an exemplary charged particle beam apparatus in which a control method consistent with the disclosed embodiments can be implemented.

FIG. 1 is a diagram illustrating an exemplary charged particle beam apparatus 100 in which a control method consistent with the disclosed embodiments can be implemented. Referring to FIG. 1, a charged particle beam apparatus 100 includes an electron source 101, a condenser lens 110, a main aperture plate 171, a source-conversion unit 120, a primary projection imaging system 130, a deflection scanning unit 132, and a beam separator 160, that are placed along and aligned with a primary optical axis 100_1. Charged particle beam apparatus 100 also includes a secondary projection imaging system 150 and an electron detection device 140 that are placed along and aligned with a secondary optical axis 150_1, which is not parallel to primary optical axis 100_1. The charged particle beam apparatus 100 further includes a sample stage 180 for sustaining a sample 8 being inspected by charged particle beam apparatus 100. Electron source 101, condenser lens 110, main aperture plate 171, source-conversion unit 120, primary projection imaging system 130, and deflection scanning unit 132 together constitute a beamlet forming unit.

Electron source 101 is configured to emit a primary electron beam 102 having a crossover 101s on primary optical axis 100_1. Source-conversion unit 120 is configured to form a plurality of virtual images 102_2v and 102_3v (not shown in FIG. 1) of electron source 101. Source-conversion unit 120 includes a micro-deflector array 122 with a plurality of micro-deflectors 122_2 and 122_3, a micro-compensator array 123 with a plurality of micro-lenses 123_1, 123_2, and 123_3, and a beamlet-limit plate 121 including a plurality of beamlet-limit openings 121_1, 121_2, and 121_3. Micro-deflectors 122_2 and 122_3 respectively deflect beamlets 102_2 and 102_3 of primary electron beam 102 to form virtual images 102_2v and 102_3v and be perpendicularly incident onto beamlet-limit plate 121. Beamlet-limit openings 121_1, 121_2, and 121_3 respectively cut off the peripheral electrons of the center part 102_1 of the primary electron beam 102 and the deflected beamlets 102_2 and 102_3, and thereby limiting currents of beamlets 102_1, 102_2, and 102_3.

Condenser lens 110 is configured to focus primary electron beam 102. The focusing power of condenser lens 110 can be controlled to adjust the current density of primary electron beam 102, thereby adjusting current densities of beamlets 102_1, 102_2, and 102_3.

Primary projection imaging system 130 is configured to project images of electron source 101 formed by beamlets 102_1, 102_2, and 102_3 onto a surface 7 of sample 8, to form a plurality of probe spots 102_1S, 102_2S, and 102_3S. Primary projection imaging system 130 includes a transfer lens 133 and an objective lens 131. Objective lens 131 is configured to focus beamlets 102_1, 102_2, and 102_3 onto surface 7 of sample 8. Objective lens 131 can include a magnetic lens having a front focal point. Transfer lens 133 is configured to focus the two off-axis beamlets 102_2 and 102_3 to pass through the front focal point of objective lens 131, so as to make them perpendicularly landing on surface 7 of sample 8. The field curvature aberrations of the condenser lens 110 and the primary projection image system 130 make the plurality of beamlets 102_1-102_3 focused on a curved surface not a flat surface or a plane. Each of the plurality of micro-lenses 123_1-123_3 in the source-conversion unit 120 can individually focus the corresponding one of the plurality of beamlets 102_1-102_3. Hence the plurality of micro-lenses can be set to make all beamlets focused on a focus plane, or make some of the beamlets focused on a focus plane and others are defocused from the focus plane. The focus plane is desired to be coincident with the sample surface.

Deflection scanning unit 132 is configured to deflect beamlets 102_1, 102_2, and 102_3, to scan probe spots 102_1S, 102_2S, and 102_3S in respective scanning areas on surface 7 of sample 8. As a result, secondary electron beams 102_1se, 102_2se, and 102_3se are generated by probe spots 102_1S, 102_2S, and 102_3S from the respective scanning areas. Secondary electron beams 102_1se, 102_2se, and 102_3se are focused by objective lens 131, and then deflected by beam separator 160 to be separated from beamlets 102_1, 102_2, and 102_3, and enter secondary projection imaging system 150 aligned with secondary optical axis 150_1.

Secondary projection imaging system 150 is configured to focus secondary electron beams 102_1se, 102_2se, and 102_3se onto a plurality of detection elements 140_1, 140_2, and 1403 of electron detection device 140. Each one of detection elements 1401, 1402, and 140_3 is configured to provide an image signal of a corresponding scanning area. Secondary projection imaging system 150 includes an anti-scanning deflector 151, a zoom lens 152 including at least two lenses 152_1 and 152_2, and an anti-rotation magnetic lens 154. Zoom lens 152 is configured to make pitches of secondary electron beam 102_1se, 102_2se, and 102_3se on the electron detection device 140 match pitches of detection elements 140_1, 140_2, and 140_3. Anti-scanning deflector 151 is configured to synchronously deflect secondary electron beams 102_1se, 102_2se, and 102_3se to keep them within the corresponding detection elements 140_1, 140_2, and 140_3, while deflection scanning unit 132 deflects beamlets 102_1, 102_2, and 102_3. Anti-rotation magnetic lens 154 is configured to eliminate rotations of secondary electron beams 102_1se, 102_2se, and 102_3se on the electron detection device 140 with respect to the detection elements 140_1, 140_2, and 140_3, wherein the rotations are introduced by a magnetic lens included in objective lens 131.

Charged particle beam apparatus 100 illustrated in FIG. 1 is an example of a charged particle beam apparatus in which a control method consistent with the disclosed embodiments can be implemented. The control method consistent with the disclosed embodiments can be applied to other charged particle beam apparatus that includes more or less and/or different arrangement of the components in charged particle beam apparatus 100 illustrated in FIG. 1. For example, in some charged particle beam apparatus, condenser lens 110 may not be included. As another example, in some charged particle beam apparatus, main aperture plate 171 may be placed above condenser lens 110.

FIG. 2(*a*) is a diagram illustrating a plan view of a beamlet available range 200 and a plurality of beamlets 210 (e.g., beamlets 102_1-102_3 in FIG. 1) generated by a charged particle beam apparatus (e.g., charged particle beam apparatus 100 of FIG. 1) on a sample being inspected (e.g., sample 8 in FIG. 1). In a normal or inspection scan, each beamlet 210 is deflected by a deflection unit (e.g., deflection scanning unit 132 of FIG. 1) to scan a corresponding scanning area 220 on the sample. Together, the plurality of beamlets 210 can scan a larger scanning region 230 of the sample to obtain an image of scanning region 230 of the sample. After the plurality of beamlets 210 scan scanning region 230, the sample can be moved by a sample stage (e.g., sample stage 180 of FIG. 1) in a X-Y plane perpendicular to a primary optical axis in Z direction (e.g., primary optical axis 100_1 of FIG. 1) of the charged particle beam apparatus, so that, in a next normal scan, the plurality of beamlets 210 can scan a next scanning region of the sample. For sake of clarity, each normal scan can be labeled a serial number No(i), and scanning region 230(*i*) means the scanning region 230 in No(i) scan. No(i+1) normal scan is the one next to No(i) normal scan. The next scanning region 230(*i*+1) may be adjacent to the present scanning region 230(*i*) as shown in FIG. 2(*b*), close to the present scanning region 230(*i*) as shown in FIG. 2(*c*), or far away from the present scanning region 230(*i*) as shown in FIG. 2(*d*). The inspection modes illustrated in FIGS. 2(*b*)-2(*d*) are respectively referred to as consecutive leap-scan mode, short leap-scan mode, and long leap-scan mode. The charged particle beam apparatus can operate on one of the three modes, or operate on one of the three modes and then change to operate on another one of the three modes.

The quality of the image produced by the charged particle beam apparatus is closely related to the focusing situations of the plurality of beamlets on the sample (i.e., whether the plurality of beamlets are focused on the sample or how much the focus plane of the plurality of beamlets approaches the sample). It would be advantageous to control the charged particle beam apparatus so that the plurality of beamlets can be focused on the sample surface. However, when the sample moves in the X-Y plane to align the next scanning region with the plurality of beamlets, several factors may influence the focusing situations thereof. On one hand, the sample surface may be moved away from the focus plane due to, for example, variations in local flatness of the sample surface or stage position in Z direction. On the other hand, the focus plane may be shifted away from the sample surface due to, for example, drifts of a focusing power of a focusing lens (e.g., condenser lens 110, transfer lens 133, or objective lens 131 in FIG. 1) which focuses the plurality of beamlets or charging-up on the sample surface.

One technique for controlling the focusing situations of the plurality of beamlets is to use an optical focus sensor to sense the position variation of the sample surface, and to feedback the sensed position variation to a controller such that the controller can control the sample stage to move in a Z-direction to eliminate the position variation of the sample surface or adjust the focusing power of at least one of the focusing lenses to move the focus plane coincident with the sample surface. One or more parameters in a focusing lens can influence the focusing power thereof. Hence the focusing power can be adjusted by varying at least one of the parameters. Consequently, the relationship between the adjusted parameter and the position variation of the sample surface may need to be calibrated in advance.

A method, which can directly sense the level of separation between the focus plane and the sample surface, is proposed. In the disclosed embodiments, a charged particle beam apparatus forms an array of beamlets on a sample, and the array includes a plurality of inspection beamlets and a plurality of focus-sensing beamlets around the inspection beamlets. The plurality of inspection beamlets is focused on a focus plane which is kept coincident with the scanning region of the sample surface in a normal scan. The focus-sensing beamlets are configured to have different defocusing levels with respect to the focus plane. An image formed by the focus-sensing beamlets can be used to estimate the real level of separation between the focus plane and the sample surface. The image can be obtained in a normal scan or a quick scan. In a quick scan, focus-sensing beamlets or plus one or a few inspection beamlets scan the sample. In a normal scan, the focus-sensing beamlets scan the sample together with the inspection beamlets. There may be one or more quick scans between two normal scans.

As used herein, the focus plane refers to a virtual plane where the focus points of multiple beamlets are located. The defocusing level of a beamlet refers to a distance between a focus point of the beamlet and a reference point (e.g., a focus point of a reference beamlet) or a reference plane (e.g., a focus plane of the plurality of inspection beamlets) in the Z-direction parallel to the primary optical axis of the charged particle beam apparatus.

Figure 3:
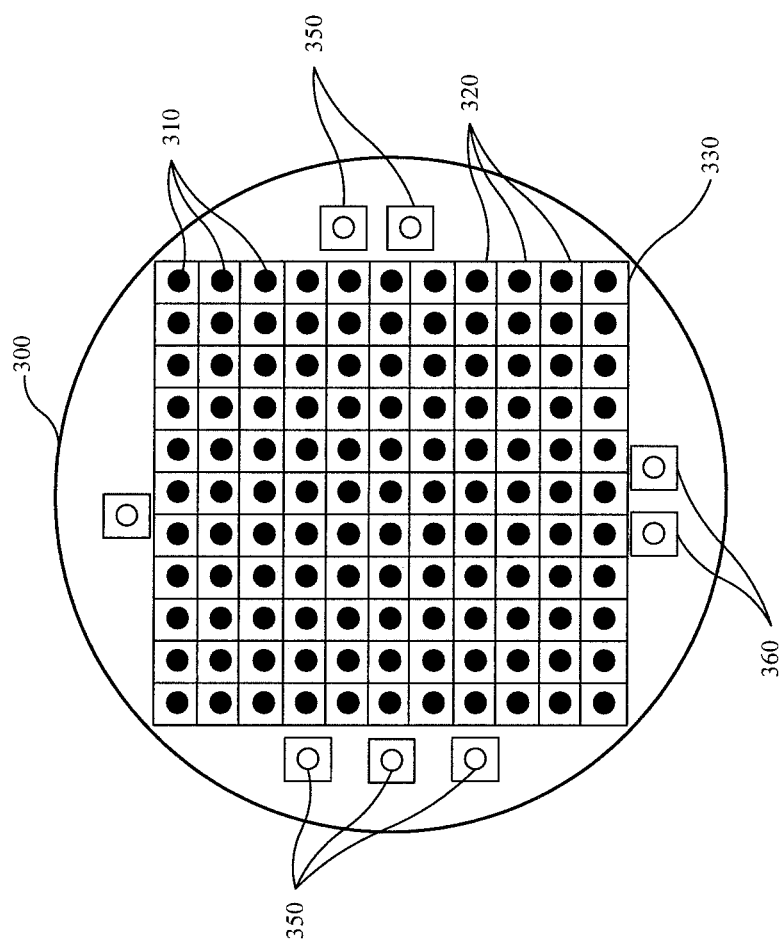
FIG. 3 is a diagram illustrating a plan view of a beamlet available range, a plurality of inspection beamlets, and a plurality of focus-sensing beamlets formed by a charged particle beam apparatus on a sample being inspected, consistent with the embodiments of the disclosure.

FIG. 3 is a diagram illustrating a plan view of a beamlet-available range 300, a plurality of inspection beamlets 310, and a plurality of focus-sensing beamlets 350 formed by a charged particle beam apparatus on a sample being inspected, consistent with the embodiments of the disclosure. Focus-sensing beamlets 350 are arranged outside of the plurality of inspection beamlets and within the beamlet-available range 300. In some embodiments, the focus-sensing beamlets are close to and surrounding the plurality of inspection beamlets 310. Both inspection beamlets 310 and focus-sensing beamlets 350 belong to an array of beamlets formed by the charged particle beam apparatus (e.g., apparatus 100 of FIG. 1.) In a normal scan, each inspection beamlet 310 is deflected by a deflection unit (e.g., deflection scanning unit 132 of FIG. 1) to scan a corresponding inspection scanning area 320 of the sample. Together, the plurality of inspection beamlets 310 can scan an inspection scanning region 330. Each focus-sensing beamlet 350 is deflected by the deflection unit to scan a focus-sensing scanning area 360 of the sample. Thus, an image obtained by the charged particle beam apparatus includes an image of inspection scanning region 330 and focus-sensing scanning areas 360.

FIGS. 4(*a*)-4(*d*) illustrate how the image of inspection scanning region 330 and focus-sensing scanning areas 360 of FIG. 3 can be used to sense the level of separation between the focus plane and the sample surface. In No(i) normal scan, as shown in FIG. 4(a), beamlets 410_1, 410_2, 410_3, 410_4, and 410_5 have defocusing levels −2, −1, 0, 1, and 2, with respect to a focus plane 430 on which the plurality of inspection beamlets 310 of FIG. 3 is focused, respectively. There is a separation gap 490 between the focus plane 430 and sample surface 440. Beamlets 410_1, 410_2, 410_4, and 410_5 may be four of the plurality of focus-sensing beamlets 350 of FIG. 3. Beamlet 410_3 can be one of the plurality of inspection beamlets 310 or can be one of the plurality of focus-sensing beamlets 350. A focus point 420_1 of beamlet 410_1 is located below focus plane 430, and a distance between focus point 420_1 and focus plane 430 is negative two arbitrary units (e.g., −100 nm); a focus point 420_2 of beamlet 410_2 is located below focus plane 430, and a distance between focus point 420_2 and focus plane 430 is negative one arbitrary unit (e.g., −50 nm); a focus point 420_3 of beamlet 410_3 is located on focus plane 430; a focus point 420_4 of beamlet 410_4 is located above focus plane 430, and a distance between focus point 420_4 and focus plane 430 is positive one arbitrary unit (e.g., 50 nm); and a focus point 420_5 of beamlet 410_5 is located above focus plane 430, and a distance between focus point 420_5 and focus plane 430 is positive two arbitrary units (e.g., 100 nm). The various defocusing levels of beamlets 410_1 through 410_5 can be realized by adjusting the focusing powers of the micro-lenses (e.g., micro-lenses 123_1-123_3 in FIG. 1) respectively corresponding to beamlets 410_1 through 410_5.

Figure 4A:
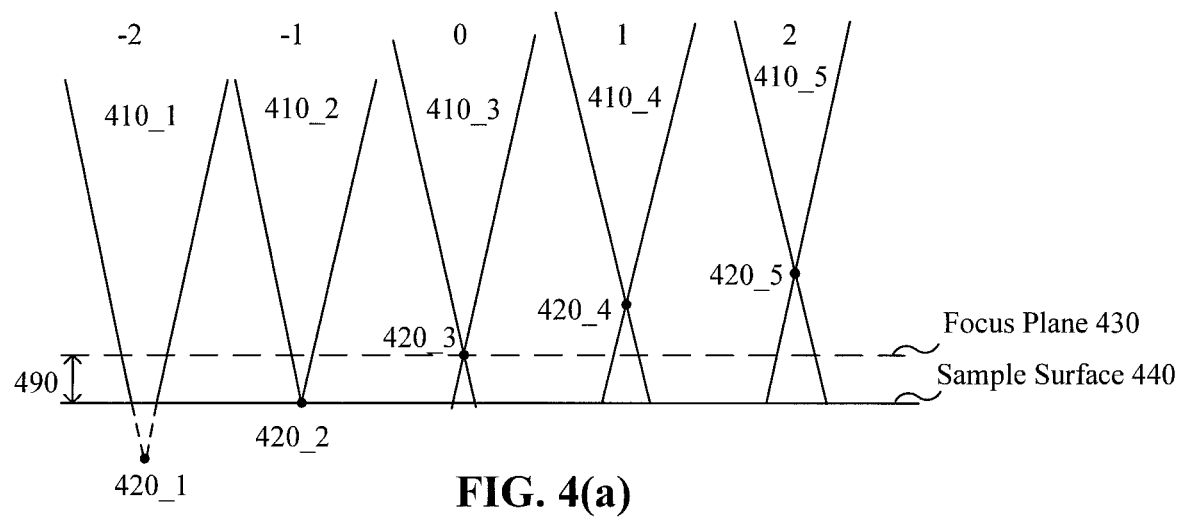
FIGS. 4(a)-4(d) illustrate an exemplary method for estimating a position of a sample surface with respect to a focus plane of a plurality of inspection beamlets formed by a charged particle beam apparatus, consistent with some disclosed embodiments.
Figure 4B:
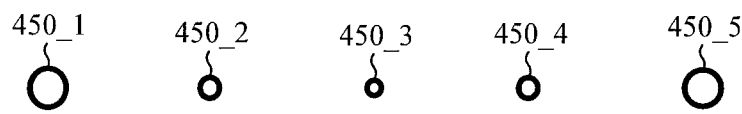

FIG. 4(b) illustrates an image of probe spots 450_1, 450_2, 450_3, 450_4, and 450_5 formed by beamlets 410_1, 410_2, 410_3, 410_4, and 410_5 on focus plane 430. The sizes of probe spots 450_1 through 450_5 will be same if beamlets 410_1, 410_2, 410_4 and 410_5 are also focused on focus plane 430. The sizes of probe spots 410_1, 410_2, 410_4 and 410_5 increase with absolute values of the defocusing levels thereof respectively. As shown in FIG. 4(b), probe spot 450_3 is the smallest among probe spots 450_1 through 450_5, probe spots 450_2 and 450_4 are substantially same and larger than probe spot 450_3, and probe spots 450_1 and 450_5 are substantially the same and larger than probe spots 450_2 and 450_4.

Figure 4C:
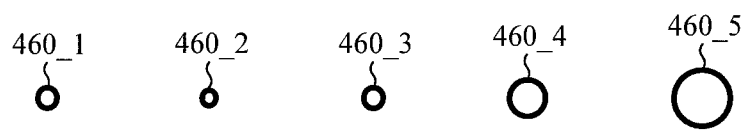

FIG. 4(c) illustrates an image of probe spots 460_1, 460_2, 460_3, 460_4, and 460_5 formed by beamlets 410_1, 410_2, 410_3, 410_4, and 410_5 on sample surface 440. As shown in FIG. 4(c), the size of each one of probe spots 450_1 through 450_5 is related to a combination of defocusing level of its corresponding one of beamlets 410_1 through 410_5, and the separation gap 490 between sample surface 440 and focus plane 430. The focus point 420_2 is coincident with sample surface 440, focus points 420_1 is closer to sample surface 440 than focus plane 430, and focus points 420_3-420_5 are closer to focus plane 430 than sample surface 440. Hence probe spots 460_1 and 460_2 are respectively smaller than probe spots 450_1 and 450_2, and probe spots 460_3, 460_4 and 460_5 are respectively larger than probe spots 450_3, 450_4 and 450_5. Consequently, probe spot 460_2 becomes the smallest among probe spots 460_1 through 460_5.

Figure 4D:
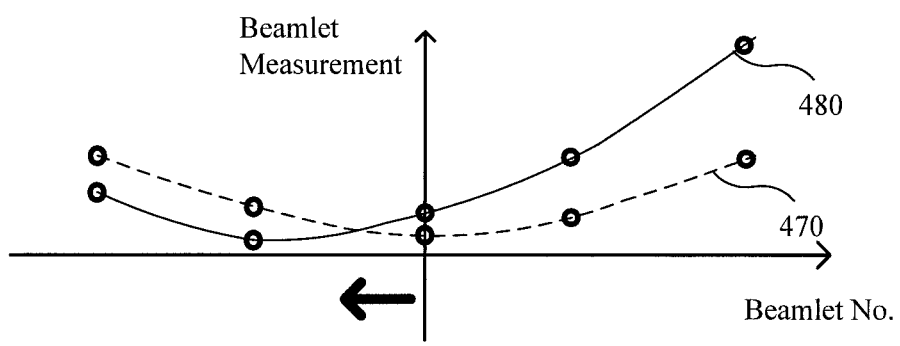

FIG. 4(d) illustrates beamlet measurements of beamlets 410_1 through 410_5 on focus plane 430 and sample surface 440. Specifically, a curve 470 represents the size of probe spots 450_1 through 450_5 formed by beamlets 410_1 through 410_5 on focus plane 430, in the order of beamlet number, i.e., from beamlet 410_1 to beamlet 410_5. A curve 480 represents the size of probe spots 460_1 through 460_5 formed by beamlets 410_1 through 410_5 on sample surface 440. If focus plane 430 is coincident with sample surface 440, the shape of the distribution on sample surface 440 will be same as the curve 470. Since the defocusing levels of beamlets 410_1 through 410_5 with respect to focus plane 430 are already known, the shape of curve 470 is already known. By comparing curves 470 and 480, it can be determined that the shape of curve 480 is not same as the shape of curve 470, and thus sample surface 440 is not coincident with focus plane 430. In addition, due to the minimum of curve 480 is shifted left one beamlet in comparison with curve 470, it can be determined that sample surface 440 is disposed below focus plane 430, with a separation level (e.g., gap 490) of one arbitrary unit. The sizes of probe spots 460_1 through 460_5 cannot be directly measured in the images of scanning areas scanned by beamlets 410_1-410_5, but can be indirectly measured by analyzing the images. For example, the smaller the probe spot size of a beamlet scanning a scanning area, the sharper the image of the scanning area is. Hence the probe spot size can be expressed by a sharpness of the image, and accordingly each beamlet measurement in FIG. 4(d) can be a sharpness of the corresponding image. The sharpness can be measured by analyzing the image with Fourier analysis.

To accurately and fast estimating the separation level, inspection beamlets 310 and focus-sensing beamlets 350 of FIG. 3 can be different in property and scanning condition. For example, an electric current of each focus-sensing beamlet 350 can be different from (e.g., lower than) an electric current of each inspection beamlet 310 so as to control charge-up on sample. The size of scanning area, scanning frequency or scanning direction of each focus-sensing beamlet 350 can be different from that of each inspection beamlet 310 so as to control charge-up on sample and throughput. For example, a scanning area of each focus-sensing beamlet 350 can be smaller than a scanning area of each inspection beamlet 310 to reduce influence of charge-up due to the focus-sensing beamlet. In addition, focus-sensing beamlets 350 may be selected in use with respect to the inspection modes and sample feature.

Figure 2A:
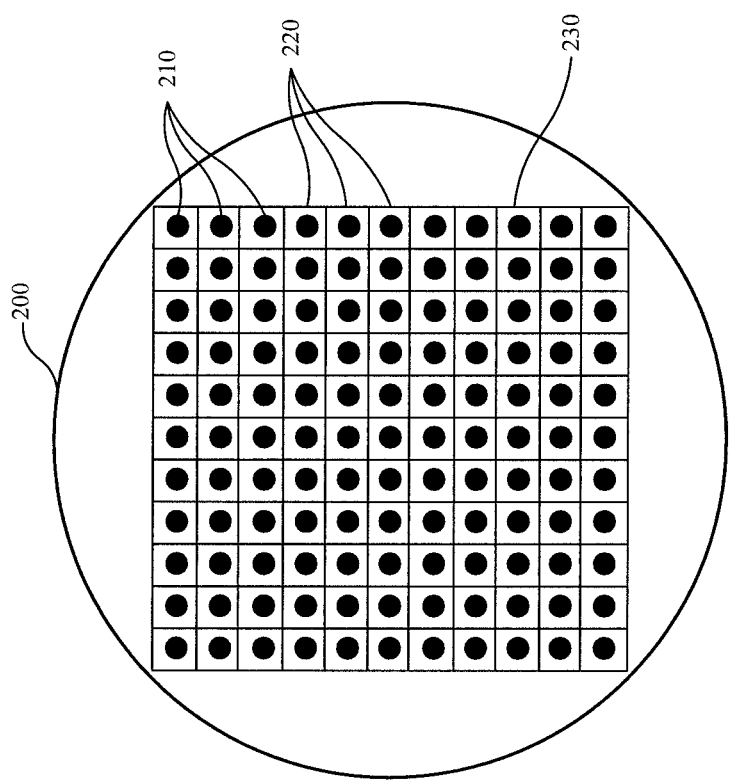
FIG. 2(a) is a diagram illustrating a plan view of a beamlet available range and a scanning region of a plurality of beamlets generated by a charged particle beam apparatus on a sample being inspected.
Figure 2B:
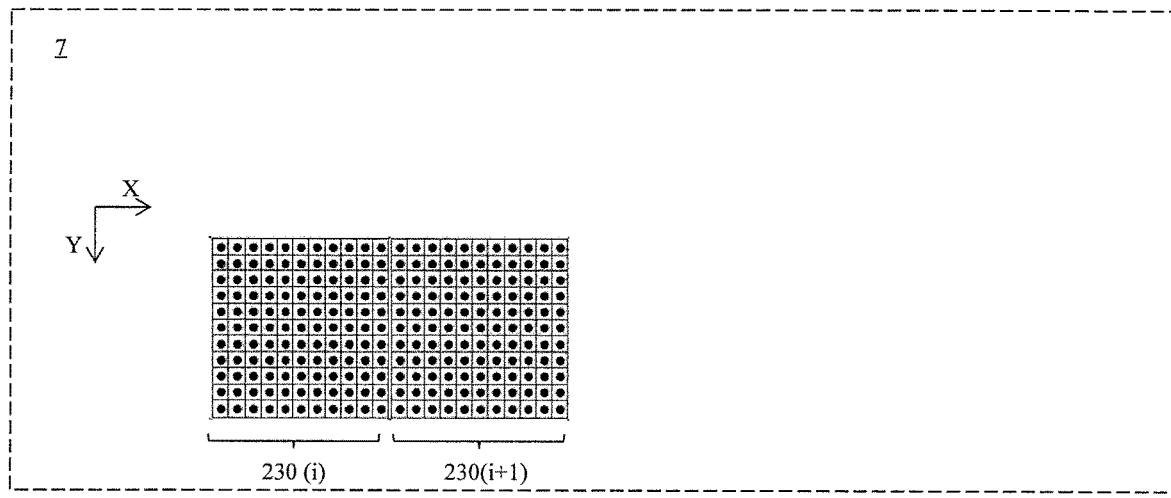
FIGS. 2(b)-2(d) are diagrams illustrating plan views of scanning regions of a plurality of beamlets generated by a charged particle beam apparatus on a sample being inspected, in three different inspection modes.
Figure 2C:
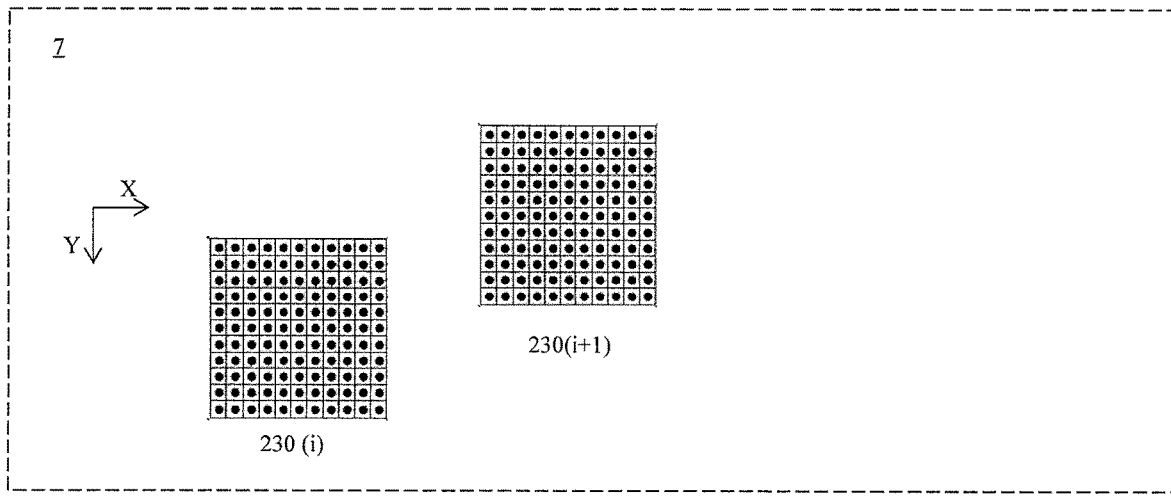

If the charged particle beam apparatus operates in the consecutive leap-scan mode or short leap-scan mode shown in FIGS. 2(b) and 2(c), the next inspection scanning region 230(i+1) is very close to the present inspection scanning region 230(i) and the time interval between the present No(i) normal scan and the next No(i+1) normal scan is very small. Hence it is reasonable to assume that the positions of sample surface 440 and the focus plane 430 will not substantially change when the sample is moved from the present inspection scanning region 230(i) to the next inspection scanning region 230(i+1). In other words, the level of separation between the focus plane 430 and the sample surface 440 in the present No(i) normal scan will remain the same in the next No(i+1) scan. The estimated separation level in the present No(i) normal scan is a reasonable estimation of the level of separation between the focus plane 430 and the sample surface 440 in the next No(i+1) normal scan. Before starting the next No(i+1) normal scan, based on the estimated separation level obtained in FIG. 4(d), the separation gap 490 between sample surface 440 and focus plane 430 of the inspection beamlets can be adjusted so that the inspection beamlets can be focused on sample surface 440 in the next No(i+1) normal scan. In some embodiments, the separation gap 490 can be reduced by, for example, raising a sample stage (e.g., sample stage 180 of FIG. 1) by one arbitrary unit, such that sample surface 440 is also raised by one arbitrary unit to coincide with focus plane 430. In some alternative embodiments, the separation gap 490 can be reduced by adjusting the focusing power of one or more focusing lenses in the charged particle beam apparatus (e.g., objective lens 131, transfer lens 133, or condenser lens 110 in FIG. 1), such that focus plane 430 is lowered by one arbitrary unit to coincide with sample surface 440. One or more parameters in a focusing lens can influence the focusing power thereof. Hence the focusing power can be adjusted by varying at least one of the parameters. In some alternative embodiments, the separation gap 490 can be reduced by raising sample surface 440 and lowering focus plane 430.

Figure 2D:
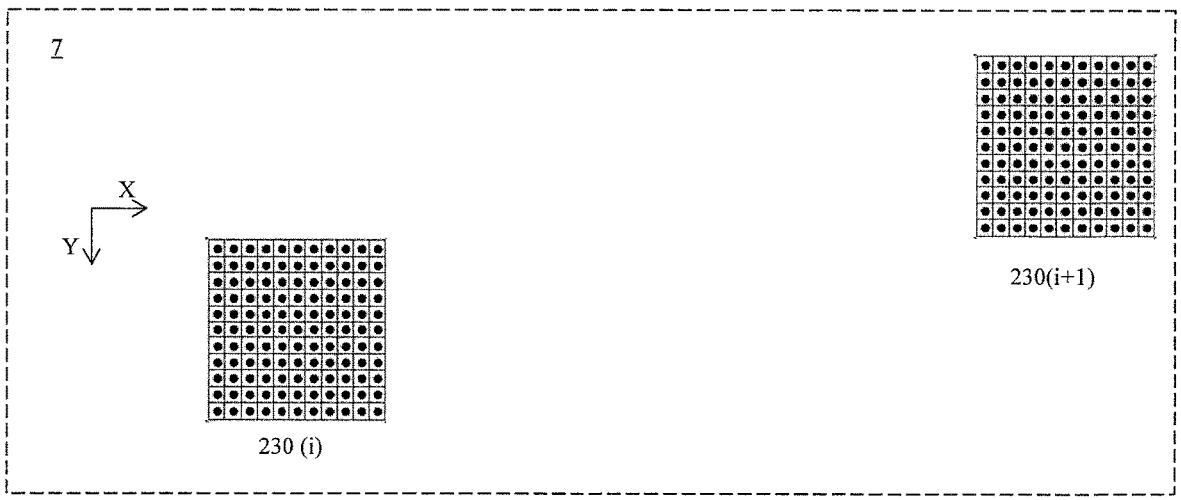

If the charged particle beam apparatus operates in the long leap-scan mode as shown in FIG. 2(d), the next inspection scanning region 230(i+1) is not close to the present inspection scanning region 230(i) and the time interval between the present No(i) normal scan and the next No(i+1) normal scan is not very small. Hence it is reasonable to assume that the positions of sample surface 440 and the focus plane 430 may change substantially when the sample is moved from the present inspection scanning region 230(i) to the next inspection scanning region 230(i+1). In other words, the level of separation between the focus plane 430 and the sample surface 440 in the next No(i+1) normal scan may be substantially different from that in the present No(i) normal scan. In this case, there are three ways to estimate the level of separation between the focus plane 430 and the sample surface 440 in the next No(i+1) normal scan. In the first way, the foregoing technique is used to obtain the position variation of sample surface 440 by using an optical focus sensor, and the level of separation in the next No(i+1) normal scan can be estimated equal to the sum of the estimated separation level in the present No(i) normal scan and the estimated position variation of sample surface 440. In the second way, the first step is to reduce the separation gap 490 between sample surface 440 and focus plane 430 in terms of the estimated separation level obtained in the first way, and the second step is to detect the separation gap 490 by the plurality of focus-sensing beamlets in a quick scan. In the second step, only all or part of the plurality of focus-sensing beamlets scans the corresponding focus-sensing scanning areas, and the method shown in FIGS. 4(a)-4(d) is used to estimate the separation level. The estimated separation level obtained in the second step is taken as the one in the next No(i+1) normal scan. In the third way, only all or part of the plurality of focus-sensing beamlets scan the corresponding focus-sensing scanning areas in a quick scan, and the method shown in FIGS. 4(a)-4(d) is used to estimate the separation level. The estimated separation level is taken as the one in the next No(i+1) normal scan. Based on the estimated level of separation in the next No(i+1) normal scan, which is obtained by one of the three ways, the separation gap 490 between sample surface 440 and focus plane 430 can be adjusted before starting the next No(i+1) normal scan so that the inspection beamlets can be focused on sample surface 440 in the next No(i+1) normal scan. As mentioned above, the separation gap 490 can be reduced by moving sample surface 440 and/or focus plane 430 in Z-direction.

In the consecutive leap-scan mode, the next inspection scanning region 230(i+1) is adjacent to the present inspection scanning region 230(i). One or more of inspection scanning areas of No(i+1) scan are already scanned by corresponding one or more focus-sensing beamlets of No(i) normal scan, one or more of focus-sensing scanning areas of No(i+1) normal scan are already scanned by corresponding one or more inspection beamlets of No(i) normal scan. Some electric charges may have been built on the scanned inspection scanning areas and focus-sensing scanning areas, and the electric charges may influence the focusing situations of inspection beamlets and focus-sensing beamlets in No(i+1) normal scan. To reduce the amount of electric charges, the electric current of each focus-sensing beamlet can be set smaller than the electric current of each inspection beamlet (e.g., the size of each beam-limit opening corresponding to a focus-sensing beamlet is smaller than the size of each beam-limit opening corresponding to an inspection beamlet in FIG. 1). To reduce the influence of the electric charges, focus-sensing beamlets 350 may be asymmetrically arranged with respect to inspection beamlets 310. For example, as illustrated in FIG. 3, three focus-sensing beamlets 350 and two focus-sensing beamlets 350 are respectively arranged at the left side and the right side of inspection scanning region 330. To avoid building electric charges in inspection scanning areas of No(i+1) normal scan when the left side of the next inspection scanning region 230(i+1) is adjacent to the present inspection scanning region 230(i), the focus-sensing beamlets 350 at the right side of inspection scanning region 330 can be not used (e.g., deflected by the corresponding micro-deflector to be blocked off by the beamlet-limit plate 121 in FIG. 1). Similarly, when the right side of the next inspection scanning region 230(i+1) is adjacent to the present inspection scanning region 230(i), the focus-sensing beamlets 350 at the left side of inspection scanning region 330 can be not used.

In the short leap-scan mode, the next inspection scanning region 230(i+1) is close to the present inspection scanning region 230(i). Hence what happens in the consecutive leap-scan mode may happen in the short leap-scan mode. The foregoing solutions can also be used in the short leap-scan mode. In the long leap-scan mode, the next inspection scanning region 230(i+1) is far away from the present inspection scanning region 230(i). Hence what happens in the consecutive leap-scan mode will not happen in the long leap-scan mode. However, some electric charges may be built in the focus-sensing scanning areas if the second and third ways are used to estimate the level of separation between sample surface 440 and focus plane 430 in FIGS. 4(a)-4(d). The electric charges may influence focusing situations of the inspection beamlets whose inspection scanning areas close to the focus-sensing scanning areas. To reduce the electric charges, the current of each focus-sensing beamlet can be set smaller than the current of each inspection beamlet, or only some of focus-sensing beamlets are used. In addition, each focus-sensing scanning area can be set smaller than each inspection scanning area. For example, when using the third way to estimate the separation level, the deflection scanning unit 132 deflects each in-use focus-sensing beamlet with an amplitude which is smaller than the amplitude in No(i+1) scan. Besides, each focus-sensing scanning area can be scanned faster than each inspection scanning area in No(i+1) normal scan. For example, when using the third way to estimate the separation level, the deflection scanning unit 132 deflects each in-use focus-sensing beamlet with a frequency that is higher than the scanning frequency in No(i+1) normal scan. Furthermore, each focus-sensing scanning area can be scanned in a direction different from the direction in which each inspection scanning area is scanned in No(i+1) normal scan.

Figure 5:
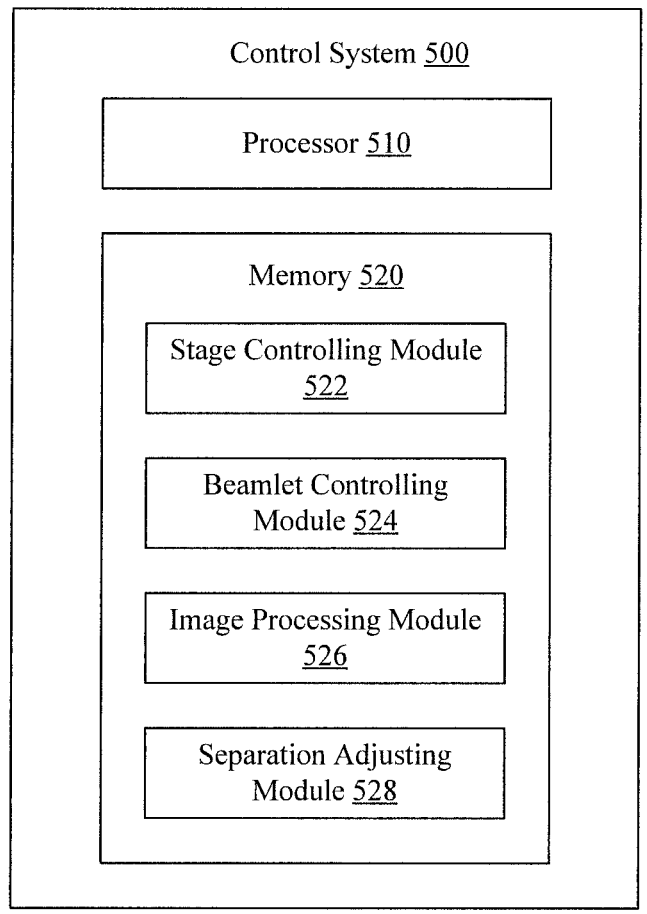
FIG. 5 illustrates an exemplary control system for controlling a charged particle beam apparatus, consistent with some disclosed embodiments.

FIG. 5 illustrates an exemplary control system 500 for controlling a charged particle beam apparatus (e.g., charged particle beam apparatus 100 of FIG. 1), consistent with some disclosed embodiments. Control system 500 can be included in the charged particle beam apparatus. Alternatively, control system 500 can be connected to the charged particle beam apparatus via a wired or wireless communication interface.

As illustrated in FIG. 5, control system 500 includes a processor 510, and a memory 520. Processor 510 can include various types of processing devices. For example, processor 510 can include a microprocessor, preprocessors (such as an image preprocessor), graphics processors, a central processing unit (CPU), support circuits, digital signal processors, integrated circuits, a field-programmable gate array (FPGA), or any other types of devices suitable for running applications for controlling the charged particle beam apparatus. In some embodiments, processor 510 can include any type of single or multi-core processor.

Memory 520 can include any types of non-transitory storage devices or computer-readable media. For example, memory 520 can include non-transitory computer readable medium. Common forms of non-transitory media include, for example, a hard drive, compact disc, solid state drive, magnetic tape, or any other magnetic data storage medium, a CD-ROM, any other optical data storage medium, any physical medium with patterns of holes, a RAM, a PROM, and EPROM, a FLASH-EPROM or any other flash memory, NVRAM, a cache, a register, any other memory chip or cartridge, and networked versions of the same. Memory 520 can store various modules that, when executed by processor 510, can cause processor 510 to perform various methods consistent with the disclosed embodiments. In the exemplary embodiment illustrated in FIG. 5, memory 520 includes a stage controlling module 522, a beamlet controlling module 524, an image processing module 526, and a separation adjusting module 528.

In general, a module can be a packaged functional hardware unit designed for use with other components (e.g., portions of an integrated circuit) or a part of a program (stored on a computer readable medium) that performs a particular function of related functions. The module can have entry and exit points and can be written in a programming language, such as, for example, Java, Lua, C or C++. A software module can be compiled and linked into an executable program, installed in a dynamic link library, or written in an interpreted programming language such as, for example, BASIC, Perl, or Python. It will be appreciated that software modules can be callable from other modules or from themselves, and/or can be invoked in response to detected events or interrupts. Software modules configured for execution on computing devices can be provided on a computer readable medium, such as a compact disc, digital video disc, flash drive, magnetic disc, or any other non-transitory medium, or as a digital download (and can be originally stored in a compressed or installable format that requires installation, decompression, or decryption prior to execution). Such software code can be stored, partially or fully, on a memory device of the executing computing device, for execution by the computing device. Software instructions can be embedding in firmware, such as an EPROM. It will be further appreciated that hardware modules can be comprised of connected logic units, such as gates and flip-flops, and/or can be comprised of programmable units, such as programmable gate arrays or processors. The modules or computing device functionality described herein are preferably implemented as software modules, but can be represented in hardware or firmware. Generally, the modules described herein refer to logical modules that can be combined with other modules or divided into sub-modules despite their physical organization or storage.

Stage controlling module 522 can, when executed by processor 510, cause processor 510 to control a sample stage (e.g., sample stage 180 of FIG. 1) to move in one or more of X, Y, and Z directions to a target position. The target position can be input by a user via a user input device, or can be determined by other components in control system 500, such as image processing module 526. In some embodiments, stage controlling module 522 can control the sample stage to sequentially move in a plurality of target positions, so that a plurality of scanning regions can be inspected by the charged particle beam apparatus. In some embodiments, the target position can be a position in the Z-direction that is determined by image processing module 526 (which will be explained below) to achieve an optimized focusing condition.

Beamlet controlling module 524 can, when executed by processor 510, cause processor 510 to control various properties of a plurality of beamlets formed by the charged particle beam apparatus, by controlling various components in the charged particle beam apparatus. For example, beamlet controlling module 524 can control a plurality of micro-deflectors (e.g., micro-deflector 122_2 or 122_3 of FIG. 1) and/or a plurality of beamlet openings (e.g., beamlet-limit opening 121_1, 121_2, or 121_3 of FIG. 1) and/or a plurality of micro-lenses (e.g., micro-lenses 123_1, 123_2 or 123_3 of FIG. 1) to form a plurality inspection beamlets focusing onto a focus plane, and one or more focus-sensing beamlets having various defocusing levels with respect to the focus plane. Beamlet controlling module 524 can control the position of the focus plane by controlling the focusing power of one or more of focus lenses that focus the array of beamlets in the charged particle beam apparatus (e.g., objective lens 131, transfer lens 133 or condenser lens 110 in FIG. 1). One or more parameters in each of the focusing lenses can influence the focusing power thereof. Hence the beamlet controlling module 524 can control the focusing power by varying at least one of the parameters. Beamlet controlling module 524 can also control a size and/or an electric current of a beamlet by controlling the aperture of a beamlet opening (e.g., beamlet-limit opening 121_1, 121_2, or 121_3). Beamlet controlling module 524 can also control a micro-deflector (e.g., micro-deflector 122_2 or 122_3) to deflect a beamlet blocked off by the beamlet-limit plate (e.g., beamlet-limit plate 121). Beamlet controlling module 524 can further control a scanning area, a scanning direction or a scanning frequency of a beamlet by controlling a deflection scanning unit (e.g., deflection scanning unit 132).

Image processing module 526 can, when executed by processor 510, cause processor 510 to process the images formed by the beamlets on a sample and collected by a detection unit (e.g., electron detection device 140), and to estimate a position of the sample surface with respect to the focus plane of the inspection beamlets (e.g., a separation level between the sample surface and the focus plane). For example, image processing module 526 can analyze the sizes of the probe spots formed by the inspection and/or focus-sensing beamlets on the sample to estimate the separation level, by using the method described with respect to FIGS. 4(*a*)-4(*d*). As another example, image processing module 526 can perform a Fourier analysis on the images to estimate the separation level. Separation adjusting module 528 can, when executed by processor 510, cause processor 510 to control the charged particle beam apparatus to adjust the separation level between the sample surface and the focus plane of the inspection beamlets, based on the result obtained by the image processing module 526. In some embodiments, separation adjusting module 528 can send a signal to stage controlling module 522 to control a position of the stage in the Z-direction, such that the sample surface can coincide with the focus plane of the inspection beamlets. In some alternative embodiments, separation adjusting module 528 can send a signal to beamlet controlling module 524 to control the position of the focus plane of the inspection beamlets, such that the sample surface can coincide with the focus plane of the inspection beamlets.

Figure 6:
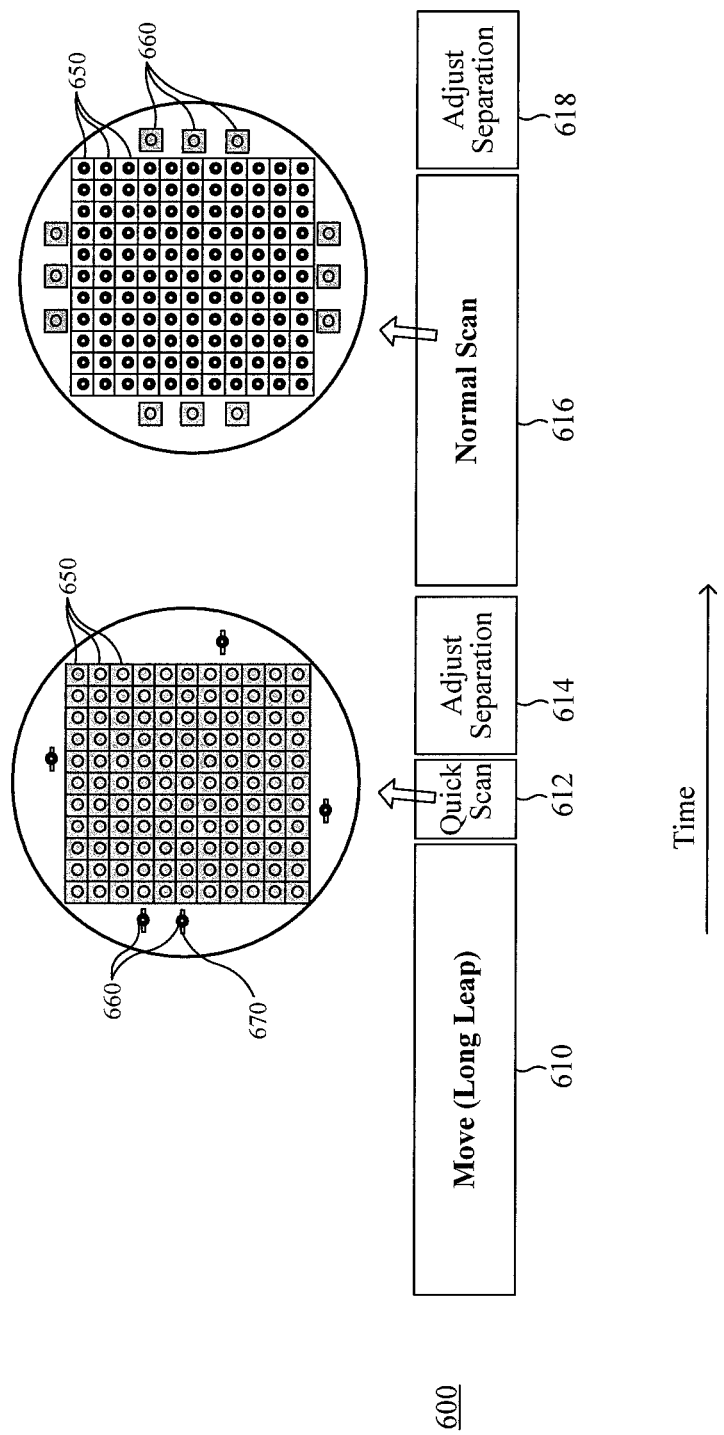
FIG. 6 illustrates an exemplary process of inspecting a sample by using a charged particle beam apparatus, consistent with some disclosed embodiments.

FIG. 6 illustrates an exemplary process 600 of inspecting a sample by using a charged particle beam apparatus (e.g., charged particle beam apparatus 100 of FIG. 1), consistent with some disclosed embodiments. The charged particle beam apparatus can form and scan an array of beamlets on a sample to be inspected (e.g., sample 8 of FIG. 1). The array of beamlets includes a plurality of inspection beamlets 650 focusing onto a focus plane, and a plurality of focus-sensing beamlets 660 having various defocusing level with respect to the focus plane. Process 600 can be performed by the charged particle beam apparatus controlled by a control system (e.g., control system 500 of FIG. 5).

First, at step 610, the charged particle beam apparatus performs a long move to move a sample stage (e.g., sample stage 180 of FIG. 1) that sustains the sample to a target position at which a first scanning region of the sample is located below and vertically aligned with the plurality of inspection beamlets 650. For example, stage controlling module 522 of control system 500 can control the sample stage to move in an X-Y plane, to the target position.

Then, at step 612, the charged particle beam apparatus performs a quick scan on the first scanning region of the sample surface to detect a separation level between the first scanning region and the focus plane of inspection beamlets 650. The quick scan can be performed by using a first subset of beamlets formed by the charged particle beam apparatus. In the example illustrated in FIG. 6, the first subset of beamlets includes only a subset of focus-sensing beamlets 660. In other words, the quick scan at step 612 is performed by using the subset of focus-sensing beamlets 660, while inspection beamlets 650 and the remaining focus-sensing beamlets (not shown) do not scan the sample surface. This can be achieved by controlling micro-deflectors (e.g., micro-deflectors 122_2 and 122_3) by, for example, beamlet controlling module 524 of control system 500, to deflect inspection beamlets 650 and the remaining focus-sensing beamlets towards directions other than the sample surface, such that these beamlets are not incident on the sample surface. In some alternative embodiments, the first subset of beamlets used for the quick scan includes a subset of inspection beamlets 650 and a subset of focus-sensing beamlets 660. In addition, during the quick scan at step 612, each beamlet can scan a relatively small beamlet scanning area or a single line on the sample surface. In the example illustrated in FIG. 6, each focus-sensing beamlet 660 scans a single line 670 on the sample surface.

After performing the quick scan, at step 614, the control system (e.g., image processing module 526 of control system 500) analyzes an image formed by the first subset of beamlets on the sample surface to estimate the separation level between the sample surface in the first scanning region and the focus plane of inspection beamlets 650. In some embodiments, the method illustrated in FIGS. 4(*a*)-4(*d*) can be implemented to estimate the separation level.

Once the separation level is determined, the control system (e.g., separation adjusting module 528 of control system 500) adjusts the separation level between the sample surface at the first scanning region with respect to the focus plane of the inspection beamlets at step 614, such that the sample surface at the first scanning region can coincide with the focus plane. In some embodiments, the control system (e.g., stage controlling module 522) can move the sample stage in the Z-direction to thereby adjust the position of the sample in the Z-direction, to reduce the separation level between the sample surface at the first scanning region and the focus plane of the primary beamlets. In some alternative embodiments, the control system (e.g., beamlet controlling module 524) can adjust the focusing power of one or more lenses (e.g., objective lens 131 and/or transfer lens 133) to move the position of the focus plane of the inspection beamlets, such that the sample surface coincides with the focus plane.

At step 616, the charged particle beam apparatus performs a normal scan on a second scanning region of the sample surface. In some embodiments, the second scanning region can be overlapped with the first scanning region on which the quick scan at step 612 is performed. In some alternative embodiments, the second scanning region can be immediately adjacent to the first scanning region. This can be achieved by controlling the sample stage by, for example, stage controlling module 522 of control system 500, to move the sample to a position at which the second scanning region is located below and vertically aligned with the plurality of inspection beamlets 650.

The normal scan at step 616 can be performed by at least a second subset of beamlets formed by the charged particle beam apparatus. In the embodiment illustrated in FIG. 6, the normal scan is performed by using all of inspection beamlets 650 and focus-sensing beamlets 660. In some alternative embodiments, the second subset of beamlets includes a subset of inspection beamlets 650 and a subset of focus-sensing beamlets 660. In some alternative embodiments, the second subset of beamlets only includes a subset or all of inspection beamlets 650. When the normal scan is performed, the separation level between the sample surface and the focus plane has been reduced to the minimum in the previous step 614. Therefore, the image quality obtained in the normal scan is improved compared to a case in which the separation level has not been adjusted.

After performing the normal scan, at step 618, the control system analyzes an image formed by the second subset of beamlets on the sample surface to estimate the separation level between the sample surface in the second scanning region and the focus plane of inspection beamlets 650. Then, the control system adjusts the separation level such that the sample surface coincides with the focus plane. The manner of performing step 618 is similar to that of step 614, and therefore the detailed description of step 618 is not repeated. After completing step 618, steps 616 and 618 can be performed iteratively to inspect other regions of the sample surface.

In some embodiments, the charged particle beam apparatus uses the separation level that has been adjusted at step 614 for any future scan. That is, step 618 can be omitted. Instead, the charged particle beam apparatus performs the normal scan at step 616 iteratively to inspect other regions of the sample surface, based on the same separation level that has been adjusted at step 614. Since there is no need for analyzing the images after the normal scan and re-adjusting the separation level, an inspection throughput gain can be improved. However, it is appreciated that these embodiments can be implemented only when it is assumed that the entire sample surface is relatively flat, and therefore the separation level does not vary substantially.

The embodiments may further be described using the following clauses:

1. A charged particle beam apparatus, comprising:
   a beamlet forming unit configured to form and scan an array of beamlets on a sample, a first portion of the array of beamlets being focused onto a focus plane, and a second portion of the array of beamlets having at least one beamlet with a defocusing level with respect to the focus plane;
   a detector configured to detect an image of the sample formed by the array of beamlets; and
   a processor configured to estimate a level of separation between the focus plane and the sample based on the detected image and then reduce the level of separation based on the estimated level.
2. The apparatus of clause 1, wherein the detector includes an array of detection elements that detect signals of the image formed by the array of beamlets respectively.
3. The apparatus of clause 1, wherein the processor is further configured to adjust a focusing power of a focusing element in the beamlet forming unit to reduce the level of separation.
4. The system of clause 1, wherein the processor is further configured to move the sample to reduce the level of separation.
5. The apparatus of any one of clauses 1 through 4, wherein one beamlet of the second portion of the array of beamlets is focused on the focus plane.
6. The apparatus of any one of clauses 1 through 5, wherein the processor is further configured to:
   control the beamlet forming unit to perform a first scan of the sample using at least a first subset of beamlets in the array of beamlets to form an image of the sample;
   reduce a level of separation based on the image of the sample; and
   control the beamlet forming unit to perform a second scan of the sample using at least a second subset of beamlets in the array of beamlets.
7. The apparatus of clause 6, wherein the first subset of beamlets includes a subset of beamlets in the second portion.
8. The apparatus of clause 6, wherein the first subset of beamlets includes the beamlets in the first portion and a subset of beamlets in the second portion.
9. The apparatus of any one of clauses 6 and 8, wherein the second subset of beamlets includes the beamlets in the first portion.
10. The apparatus of any one of clauses 6, 7 and 8, wherein the second subset of beamlets includes the beamlets in the first portion and a subset of beamlets in the second portion.
11. The apparatus of clause 7, wherein the second subset of beamlets includes the beamlets in the first portion.
12. The apparatus of clause 11, wherein a scanning condition of each beamlet of the second portion is different from a scanning condition of each beamlet of the first portion.
13. The apparatus of clause 12, wherein the scanning condition is scanning area.
14. The apparatus of clause 13, wherein the scanning area of each beamlet of the second portion is smaller than the scanning area of each beamlet of the first portion.
15. The apparatus of clause 12, wherein the scanning condition is scanning frequency.
16. The apparatus of clause 15, wherein the scanning frequency of each beamlet of the second portion is higher than the scanning frequency of each beamlet of the first portion.
17. The apparatus of clause 12, wherein the scanning condition is scanning direction.
18. The apparatus of any one of clauses 1 through 17, wherein the second portion is close to and surrounds the first portion.
19. The apparatus of clause 18, wherein the second portion is asymmetrically arranged with respect to the first portion.
20. The apparatus of any one of clauses 1 through 19, wherein an electric current of each beamlet of the second portion is different from an electric current of each beamlet of the first portion.
21. The apparatus of clause 20, wherein the electric current of each beamlet of the second portion is lower than electric current of each beamlet of the first portion.
22. The apparatus of any one of clauses 6 through 21, further comprising a scanning region of the sample in the first scan that is different from a scanning region of the sample in the second scan.
23. The apparatus of any one of clauses 1 through 22, wherein the charged particle beam apparatus is an electron beam apparatus.
24. A method of controlling a charged particle beam apparatus, comprising: forming an array of beamlets on a sample, a first portion of the array of beamlets being focused onto a focus plane, and a second portion of the array of beamlets having at least one beamlet with a defocusing level with respect to the focus plane;
   detecting an image of the sample formed by the array of beamlets;
   estimating a level of separation between the focus plane and the sample based on the detected image; and
   reducing the level of separation based on the estimated level.
25. The method of clause 24, further comprising:
   adjusting a focusing power of a focusing element in a beamlet forming unit to reduce the level of separation.
26. The method of clause 24, further comprising:
   moving the sample to reduce the level of separation.
27. The method of clause 24, further comprising:
   performing a first scan of the sample using at least a first subset of beamlets in the array of beamlets to form an image of the sample;
   reducing a level of separation based on the image of the sample formed by the first subset of beamlets; and
   performing a second scan of the sample using at least a second subset of beamlets in the array of beamlets.
28. The method of clause 27, wherein the first subset of beamlets includes a subset of beamlets in the second portion.
29. The method of clause 27, wherein the first subset of beamlets includes the beamlets in the first portion and a subset of beamlets in the second portion.
30. The method of clause 27, wherein the second subset of beamlets includes the beamlets in the first portion.
31. The method of clause 27, wherein the second subset of beamlets includes the beamlets in the first portion and a subset of beamlets in the second portion.
32. The method of clause 27, wherein a scanning condition of each beamlet in the first scan is different from a scanning condition of each beamlet in the second scan.
33. The method of clause 32, wherein the scanning condition is scanning area.
34. The method of clause 33, wherein the scanning area of each beamlet in the first scan is smaller than the scanning area of each beamlet in the second scan.
35. The method of clause 32, wherein the scanning condition is scanning frequency.
36. The method of clause 35, wherein the scanning frequency of each beamlet in the first scan is higher than the scanning frequency of each beamlet in the second scan.
37. The method of clause 32, wherein the scanning condition is scanning direction.

38. The method of clause 24, wherein an electric current of each beamlet of the second portion is different from an electric current of each beamlet of the first portion.

39. The method of clause 38, wherein the electric current of each beamlet of the second portion is lower than electric current of each beamlet of the first portion.

40. A method performed by a controller for controlling a charged particle beam system, comprising:
estimating a level of separation between a focus plane and a sample based on an image of the sample formed by an array of beamlets, a first portion of the array of beamlets being focused onto the focus plane, and a second portion of the array of beamlets having at least one beamlet with a defocusing level with respect to the focus plane; and
adjusting the level of separation based on the estimated level.

41. A non-transitory computer-readable medium that stores a set of instructions that is executable by at least one processor of a controller to cause the controller to perform a method for controlling a charged particle beam system, the method comprising:
estimating a level of separation between a focus plane and a sample based on an image of the sample formed by an array of beamlets, a first portion of the array of beamlets being focused onto the focus plane, and a second portion of the array of beamlets having at least one beamlet with a defocusing level with respect to the focus plane; and adjusting the level of separation based on the estimated level.

The charged particle beam apparatus of the disclosed embodiments uses a plurality of focus-sensing beamlets having various defocusing levels with respect to a focus plane of a plurality of inspection beamlets to detect a separation level between a sample surface and the focus plane. Compared to a system using only an optical focus sensor, the charged particle beam apparatus of the disclosed embodiments provides improved focus performance, better image resolution, and stability.

While various embodiments have been described in the present disclosure, other embodiments will be apparent to those skilled in the art from consideration of the specification and practice of the disclosed embodiments. It is intended that the specification and examples be considered as exemplary only, with a true scope and spirit of the present disclosure being indicated by the following claims.

What is claimed is:

1. A charged particle beam apparatus, comprising:
a beamlet forming unit configured to form and scan an array of beamlets on a sample to form a plurality of probe spots on the sample, the array of beamlets comprising:
a first portion comprising a beamlet focused onto a focus plane substantially orthogonal to a primary optical axis; and
a second portion comprising a defocused beamlet with respect to the focus plane;
a detector configured to detect signals from the plurality of probe spots formed by the array of beamlets; and
a processor configured to cause the charged particle beam apparatus to:
generate an image of the sample based on the detected signals;
estimate, from the image, a separation gap between the focus plane and the sample based on a comparison of a size of a beamlet of the array of beamlets along the focus plane and a size of a corresponding probe spot on the sample; and
reduce the estimated separation gap.

2. The apparatus of claim 1, wherein the detector includes an array of detection elements configured to detect signals from the plurality of probe spots.

3. The apparatus of claim 1, wherein the processor is further configured to cause the charged particle beam apparatus to adjust a focusing power of a focusing element in the beamlet forming unit to reduce the separation gap.

4. The apparatus of claim 1, wherein the processor is further configured to cause the charged particle beam apparatus to raise the sample to reduce the separation gap.

5. The apparatus of claim 1, wherein the second portion of the array of beamlets comprises at least one beamlet focused on the focus plane.

6. The apparatus of claim 1, wherein the processor is further configured to cause the charged particle beam apparatus to:
control the beamlet forming unit to perform a first scan of the sample using at least a first subset of beamlets in the array of beamlets to form the image of the sample;
reduce the separation gap based on the image of the sample; and
control the beamlet forming unit to perform a second scan of the sample using at least a second subset of beamlets in the array of beamlets.

7. The apparatus of claim 6,
wherein the first subset of beamlets includes a subset of beamlets in the second portion,
wherein the first subset of beamlets includes the beamlets in the first portion and a subset of beamlets in the second portion,
wherein the second subset of beamlets includes the beamlets in the first portion, or
wherein the second subset of beamlets includes the beamlets in the first portion and a subset of beamlets in the second portion.

8. The apparatus of claim 1, wherein a scan characteristic of each of the beamlets of the first and the second portion of the array of beamlets is different.

9. The apparatus of claim 8, wherein the scan characteristic comprises a size of a scan area.

10. The apparatus of claim 9, wherein the size of the scan area of each beamlet of the second portion is smaller than the scan area of each beamlet of the first portion.

11. The apparatus of claim 8, wherein the scan characteristic comprises a scan frequency.

12. The apparatus of claim 11, wherein the scan frequency of each beamlet of the second portion is higher than the scan frequency of each beamlet of the first portion.

13. The apparatus of claim 8, wherein the scan characteristic comprises a scan direction.

14. A method performed by a controller for controlling a charged particle beam system, the method comprising:
scanning an array of beamlets on a sample to form a plurality of probe spots on the sample;
generating an image of the sample based on detected signals from the plurality of probe spots;
estimating, from the image, a separation gap between a focus plane and the sample based on a comparison of a size of a beamlet of the array of beamlets along the focus plane and a size of a corresponding probe spot on the sample formed by the array of beamlets, wherein
a first portion of the array of beamlets is focused onto the focus plane, the focus plane being substantially orthogonal to a primary optical axis, and
a second portion of the array of beamlets comprises a defocused beamlet with respect to the focus plane; and
adjusting the estimated separation gap.

15. A non-transitory computer-readable medium that stores a set of instructions that is executable by at least one processor of a controller to cause the controller to perform a method for controlling a charged particle beam system, the method comprising:

scanning an array of beamlets on a sample to form a plurality of probe spots on the sample;

generating an image of the sample based on detected signals from the plurality of probe spots;

estimating, from the image, a separation gap between a focus plane and the sample based on a comparison of a size of a beamlet of the array of beamlets along the focus plane and a size of a corresponding probe spot on the sample formed by the array of beamlets, wherein a first portion of the array of beamlets is focused onto the focus plane, the focus plane being substantially orthogonal to a primary optical axis, and a second portion of the array of beamlets comprises a defocused beamlet with respect to the focus plane; and adjusting the estimated separation gap.

16. The apparatus of claim 1, wherein:

the first portion of the array of beamlets comprises an inspection beamlet configured to scan an inspection region of the sample; and the second portion of the array of beamlets comprises a focus-sensing beamlet configured to scan a focus-sensing region of the sample.

17. The apparatus of claim 8, wherein the scan characteristic comprises a probe current, and wherein the probe current of each of the second portion of the array of beamlets is smaller than the probe current of each of the first portion of the array of beamlets.

18. The apparatus of claim 1, wherein the processor is further configured to perform Fourier analysis of the generated image to determine the size of the corresponding probe spot on the sample.

19. The apparatus of claim 1, wherein the processor is further configured to adjust a parameter of a focusing lens to reduce the estimated separation gap, the parameter comprising a focusing power.

20. The method of claim 14, further comprising performing a Fourier analysis of the generated image to determine the size of the corresponding probe spot on the sample.

* * * * *